United States Patent [19]

Takahashi et al.

[11] Patent Number: 5,270,592
[45] Date of Patent: Dec. 14, 1993

[54] CLOCK SUPPLY CIRCUIT LAYOUT IN A CIRCUIT AREA

[75] Inventors: Tadao Takahashi; Ichiro Yamamoto; Hiroyuki Fukuyama, all of Tokyo, Japan

[73] Assignee: Oki Electric Industry Co., Ltd., Tokyo, Japan

[21] Appl. No.: 933,345

[22] Filed: Aug. 21, 1992

[30] Foreign Application Priority Data

Aug. 23, 1991 [JP] Japan .................................. 3-212318
Apr. 14, 1992 [JP] Japan .................................. 4-94184

[51] Int. Cl.$^5$ ........................ H03K 19/01; H03K 5/13
[52] U.S. Cl. ............................ 307/482.1; 307/465.1; 307/303; 307/269
[58] Field of Search ................... 307/482.1, 465.1, 480, 307/303, 303.1, 269, 441

[56] References Cited

U.S. PATENT DOCUMENTS

| | | | |
|---|---|---|---|
| 4,769,558 | 9/1988 | Bach | 307/480 |
| 4,812,684 | 3/1989 | Yamagiwa et al. | 307/480 |
| 4,851,717 | 7/1989 | Yabe | 307/480 |
| 4,857,765 | 8/1989 | Cahill et al. | 307/480 |
| 5,012,427 | 4/1991 | Kuribayashi | 307/480 |
| 5,029,279 | 7/1991 | Sasaki et al. | 307/480 |
| 5,164,817 | 11/1992 | Eisenstadt et al. | 307/480 |
| 5,172,330 | 12/1992 | Wantanabe et al. | 307/482.1 |

FOREIGN PATENT DOCUMENTS 1-157115 6/1989 Japan .

*Primary Examiner*—Edward P. Westin
*Assistant Examiner*—Richard Roseen
*Attorney, Agent, or Firm*—Edward D. Manzo

[57] ABSTRACT

A clock supply circuit having a circuit area includes an input terminal for receiving a clock pulse and a buffer having an input electrically connected to the input terminal and an output. The buffer is disposed in the center of the circuit area. The clock supply circuit also includes a main conductive pattern electrically connected to the output of the buffer. The main conductive pattern is disposed through the center of the circuit area. Each of the branch conductive patterns is electrically connected to the main conductive pattern and extends from the main conductive pattern. Also, each of the branch conductive patterns has a width smaller than the width of the main conductive pattern. Each of the clock receiving circuits is electrically connected to one of the branch conductive patterns and disposed in the circuit area. The number of the clock receiving circuits electrically connected to one branch conductive pattern is same.

17 Claims, 3 Drawing Sheets

CLOCK SUPPLY CIRCUIT LAYOUT IN A CIRCUIT AREA

CROSS REFERENCE TO RELATED APPLICATIONS

This application claims priority of Japanese patent application Ser. No. 3-212,318, filed Aug. 23, 1991, and Japanese patent application Ser. No. 4-94,184, filed Apr. 4, 1992, both of the subject matters of which are incorporated herein by reference.

BACKGROUND OF THE INVENTION

The present invention relates to a clock supply circuit suitable for use in a semiconductor integrated circuit. More specifically, the present invention relates to a clock supply circuit suitable for use in a semicustom LSI which enables the design of a circuit based on conductors or conductive patterns determined by a user, particularly a full-face element spread-type (sea of gates type) LSI.

In clock supply circuits for supplying clock pulses to logic circuits activated in response to the clock pulses, there occurs a time difference, i.e., variations in time delays in the respective clock pulses input to the corresponding logic circuits. This results from the fact that conductive patterns between the clock supply circuits and their corresponding logic circuits are different in length from one another.

There have therefore been proposed a method disclosed in Japanese Patent Application Laid-Open Publication No. 1-157115 and a method disclosed in VLD89-103 entitled "0.8 μm CMOSSOG with High-Performance Clock Distributing Function" by Institute of Electronic Information and Communication and Society for Research of VLSI Design and Technology. In the former disclosure, an area where logic circuits exist are divided into a plurality of regions each of which has a clock pulse supply circuit disposed centrally therein in such a manner that conductive patterns between the clock pulse supply circuit and the individual logic circuits are equal in length to each other. In the latter disclosure as well, clock supply circuits are disposed in both ends of respective areas where logic circuits exist. A main conductive pattern is provided so as to be electrically connected with both ends of the respective areas. A clock pulse is supplied from the main conductive pattern to the respective logic circuits via branch conductive patterns.

However, each of the clock supply circuits has been positioned as described above. It is therefore necessary to provide regions dedicated to the clock supply circuits. Further, the clock supply circuits cannot be also disposed flexibly depending on the positions where the logic circuits exist.

SUMMARY OF THE INVENTION

With the foregoing problems in view, it is an object of the present invention to provide a clock supply circuit whose position can be changed depending on the location where each of logic circuits exists.

It is another object of the present invention to provide a clock supply circuit which makes it unnecessary to provide a region dedicated to the clock supply circuit.

The above objects are generally achieved according to the present invention by a clock supply circuit having a circuit area comprising: an input terminal for receiving a clock pulse, a buffer having an input electrically connected to the input terminal, the buffer disposed in the center of the circuit area. The clock supply circuit of the present invention further comprises a main conductive pattern electrically connected to the output of the buffer, the main conductive pattern disposed through the center of the circuit area. Each of the branch conductive patterns is electrically connected to the main conductive pattern and extends from the main conductive pattern. The width of the branch conductive pattern is smaller than that of the main conductive pattern. Each of the clock receiving circuits is electrically connected to one of said branch conductive patterns and disposed in the circuit area. The number of the clock receiving circuits electrically connected to one branch conductive pattern is substantially same.

The above and other objects, features and advantages of the present invention will become apparent from the following description and the appended claims, taken in conjunction with the accompanying drawings in which preferred embodiments of the present invention are shown by way of illustrative example.

DETAILED DESCRIPTION OF THE PREFERRED EMBODIMENTS

Figure 1:
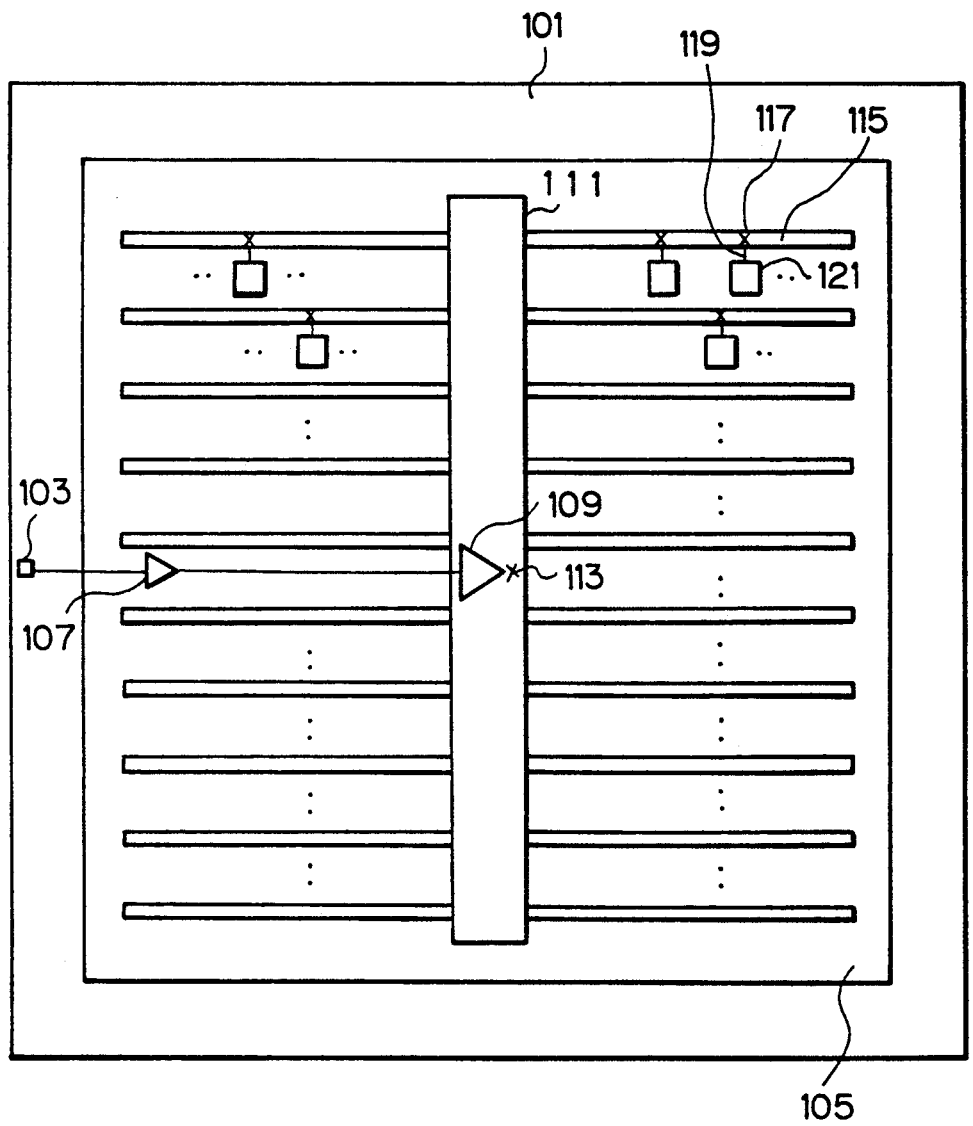
FIG. 1 is a view showing a semicustom IC according to a first embodiment of the present invention.

FIG. 1 is a view for describing a first embodiment of the present invention. A clock pulse is input to a clock input terminal 103 fabricated on an I/O area 101. The clock input terminal 103 is electrically connected to a second buffer (clock supply circuit) 109 formed substantially in the center of a user design area 105 via a first buffer (input buffer) 107 formed in the user design area 105. The second buffer 109 can drive all the logic circuits which will be described later. A main conductive pattern 111 serving as an upper conductive pattern different from conductors or conductive patterns disposed in the user design area 105 is fabricated over the second buffer 109. The main conductive pattern 111 has an increased width as is apparent from FIG. 1 and is electrically connected to the second buffer 109 via a contact 113. A plurality of branch conductive patterns 115 extend from the main conductive pattern 111. The branch conductive patterns 115 are formed in either the same layer as the main conductive pattern 111 or upper and/or lower layers thereof. When the branch conductive patterns 115 are formed as either the upper layer or the lower layer, the main conductive pattern 111 is electrically connected to the branch conductive patterns 115 via the contact 113. The branch conductive patterns 115 are wider than normally-used conductive patterns (e.g., the conductive patterns disposed in the user design area 105), but narrower than the main conductive pattern 111. The branch conductive patterns 115 are electrically connected to their corresponding logic circuits 121 via contacts 117 and conductive patterns 119 disposed in the user design area 105. The branch conductive patterns 115 are positioned in such a manner that the logic circuits 121, which are substantially identical in number for every branch conductive patterns 115, are electrically connected to the respective branch conductive patterns 115 by the conductive patterns 119 whose lengths are substantially equal to each other (preferably the shortest).

A description will now be made of transmission of the clock pulse in a circuit according to the first embodiment. The clock pulse is input to the clock input terminal 103 and transmitted to the second buffer 109 via the first buffer 107. The second buffer 109 outputs the input clock pulse to the main conductive pattern 111. The clock pulse is then transmitted to each of the branch conductive patterns 115 from the main conductive pattern 111. However, time differences or variations in time delays of the clock pulse are scarcely developed between the respective adjacent branch conductive patterns 115 because the main conductive pattern 111 is wide. Afterwards, the clock pulse is supplied to each of the logic circuits 121 via the conductive pattern 119 from the branch conductive pattern 115. At this case, variations in time delays of the clock pulse, which are developed between the respective adjacent conductive patterns 119, can be neglected because the branch conductive patterns 115 are formed so as to be wider than the conductive patterns 119. The conductive patterns 119 are designed in such a manner that they are identical in length to one another. Consequently, the clock pulse free of any variation in the time delay, which is developed between the respective adjacent logic circuits 121, is supplied to each of the logic circuits 121.

Figure 2:
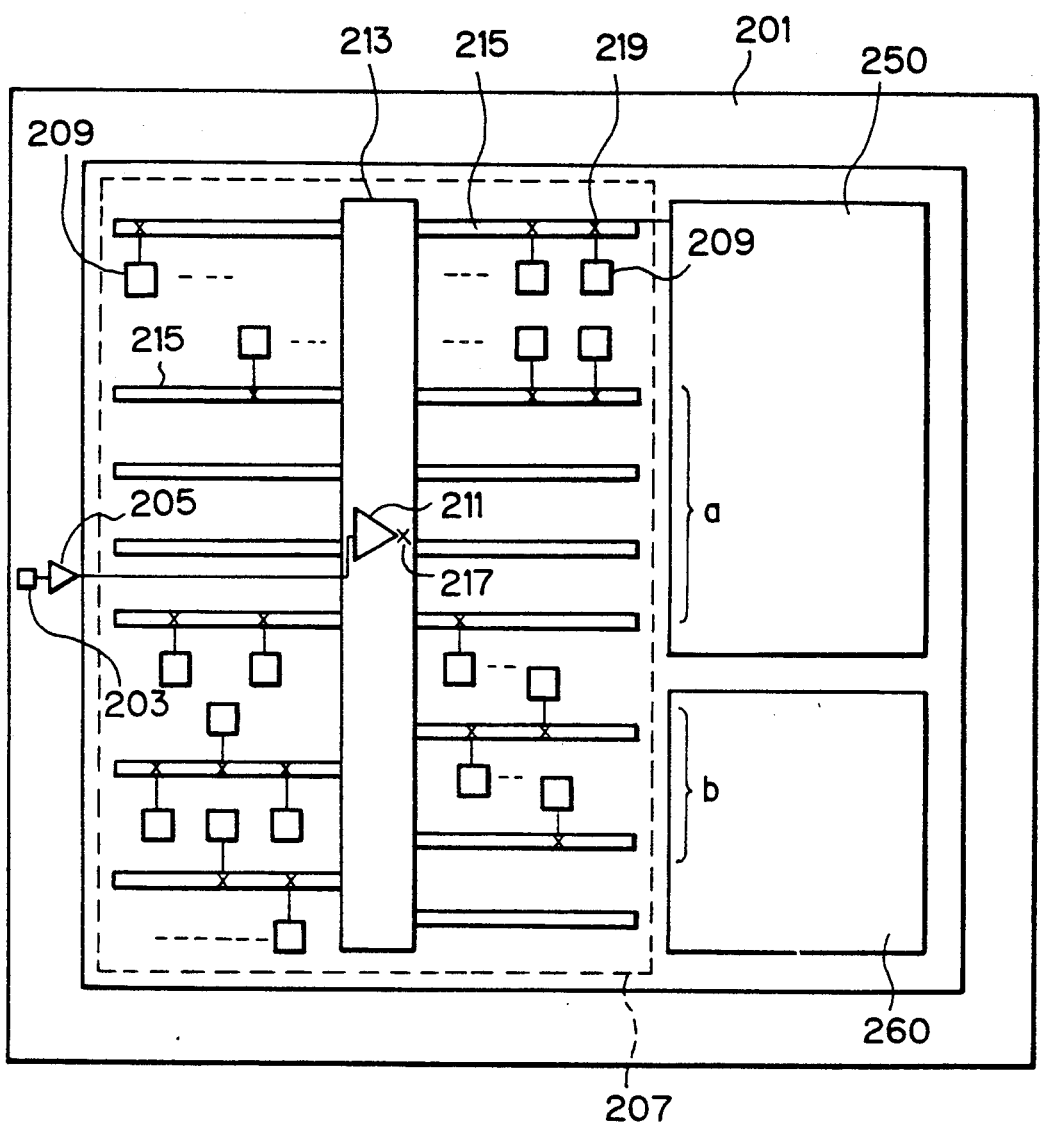
FIG. 2 is a view illustrating a semicustom IC according to a second embodiment of the present invention.

A second embodiment of the present invention will now be described with reference to FIG. 2. In FIG. 2, a clock input terminal 203 and an input buffer 205 electrically connected to the clock input terminal 203 are disposed in an I/O area 201. A semicustom IC according to the present embodiment has a RAM 250, a megacell 260 and a user design area 207. The user design area 207 includes a plurality of logic circuits 209 which have been designed by a user and activated in response to a clock pulse. The user design area 207 also has a clock supply circuit 211 disposed substantially in the center thereof as seen from the logic circuits 209. The clock supply circuit 211 enables all the logic circuits 209 to operate. The clock supply circuit 211 is electrically connected to the input buffer 205 so as to receive the clock pulse from the input buffer 205. An upper conductive pattern is formed above the user design area 207 with an insulating film interposed therebetween. The upper conductive pattern comprises a main conductive pattern 213 and a plurality of branch conductive patterns 215. The main conductive pattern 213 extends above the clock supply circuit 211 and is electrically connected to the output of the clock supply circuit 211 via the contact 217. The main conductive pattern 213 is disposed substantially in the center of the user design area 207 as seen from the transverse direction thereof and extends to a maximum along the longitudinal direction thereof. The main conductive pattern 213 is designed so as to have a broad width of 9.2 μm. The branch conductive patterns 215 are fabricated in plural form on both sides of the main conductive pattern 213 along the transverse direction of the user design area 207. A substantially equal number of the logic circuits 209 are electrically connected to the respective branch conductive patterns 215 via the contacts 219. The branch conductive patterns 215 are formed in such a manner that conductive patterns between the branch conductive patterns 215 and the logic circuits 209 electrically connected to the branch conductive patterns 215 are minimized in length and the logic circuits 209, which are substantially equal in number for each branch conductive pattern 215, are electrically connected to the respective branch conductive patterns 215. In the present embodiment, logic circuits 209, which are about 20 through 30 in number, are electrically connected to a single branch conductive pattern 215. Accordingly, the branch conductive patterns 215 are provided at narrow intervals in a region a where the logic circuits 209 are in close order. In a region b sparsely dotted with the logic circuits 209, however, the branch conductive patterns 215 are also sparsely formed. The widths of the branch conductive patterns 215 are designed so as to have 2.4 μm and are wider than a conductive pattern width of 1.2 μm in the user design area 207.

A description will now be made of a method of laying out the above-described semicustom IC. It is premised that this method is basically carried out by computer-aided design (CAD).

A plurality of logic circuits 209 are first formed in the user design area 207 by a user or at user's request. Then, the main conductive pattern 213 is positioned centrally as seen in the direction in which the logic circuits 209 extend. The branch conductive patterns 215 are positioned based on a positional relationship to the logic circuits 209 in such a manner that the logic circuits 209 serve as uniform loads with respect to the respective branch conductive patterns 215 (i.e., the same number of logic circuits 209 are electrically connected to the respective branch conductive patterns 215 at the shortest distances). Afterwards, the clock supply circuit 211 is fabricated under or near the main conductive pattern 213 in such a manner that an output transistor is disposed in the most suitable place as seen from the branch conductive patterns 215 thus positioned. Finally, the conductive patterns referred to above are formed such that the distances to the individual branch conductive patterns 215 as seen from the respective logic circuits 209 are minimized.

Incidentally, only the method of laying out the semicustom IC has been described in the above. It is needless to say that the main conductive pattern 213 and the branch conductive patterns 215 are fabricated in a manufacturing step after the formation of the above conductive patterns has been completed.

Figure 3:
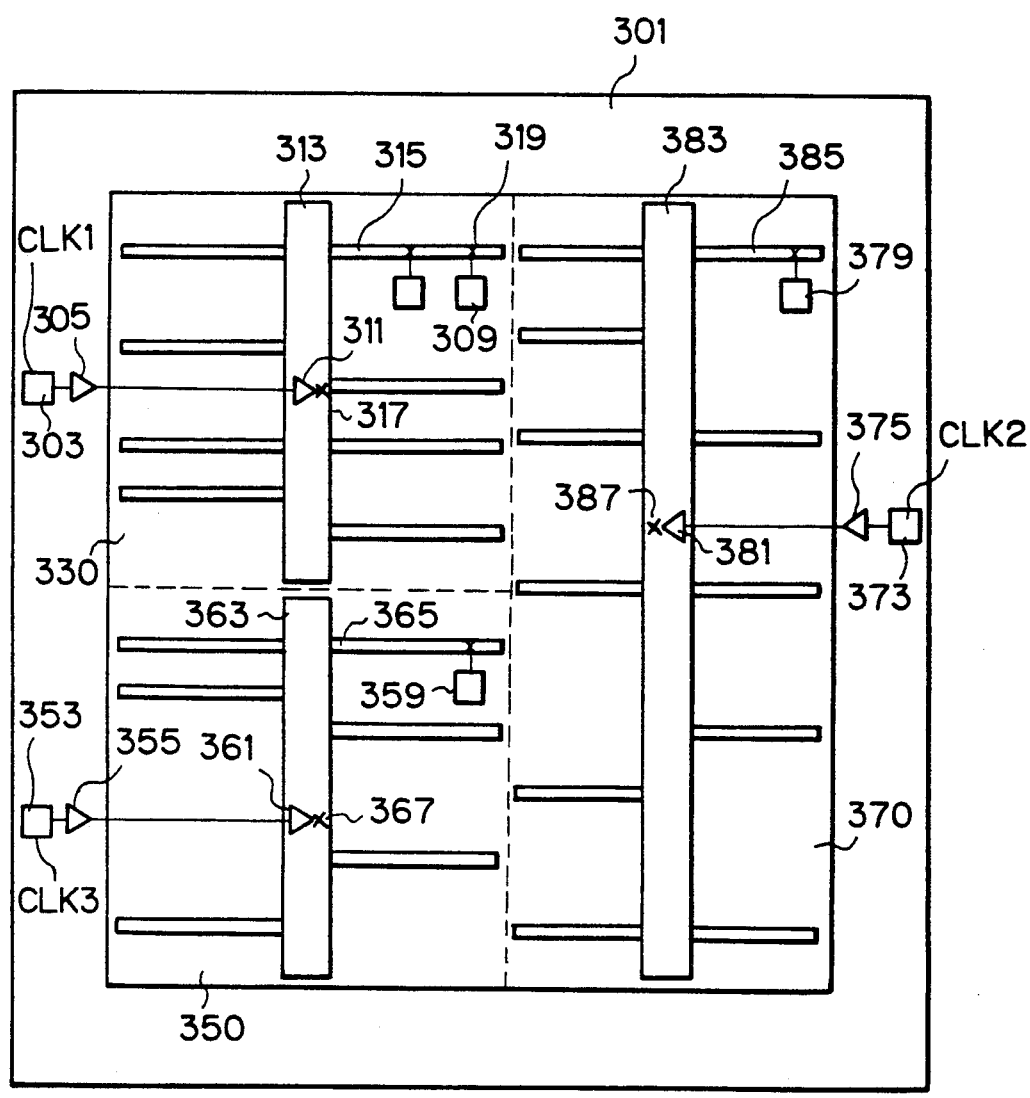
FIG. 3 is a view depicting a semicustom IC according to a third embodiment of the present invention.

FIG. 3 shows a semicustom IC according to a third embodiment of the present invention. The semicustom IC will be described below with reference to FIG. 3.

The semicustom IC according to the present embodiment is disposed in such a manner that module structures of logical circuits are retained therein. Modules have user design areas 330, 350, 370 respectively. The user design areas 330, 350, 370 are provided with a plurality of logic circuits 309, 359, 379, respectively, designed by a user, which are activated in response to different clock pulses CLK1, CLK2, CLK3, respectively. The clock pulses CLK1, CLK2, CLK3 are different in frequency and phase from one another. These clock pulses CLK1, CLK2, CLK3 may be input directly from the outside of the semicustom IC. Alternatively, those produced by frequency-dividing and delaying clock pulses generated from a common clock generator may be used.

The semicustom IC shown in FIG. 3 is of the same structure as the semicustom IC depicted in FIG. 1 in such a manner that variations in time delays of the respective clock pulses CLK1, CLK2, CLK3 are not developed in the user design areas 330, 350, 370 respectively. The user design area 330 will be described below as an illustrative example.

An I/O area 301 is provided with a clock input terminal 303 to which the clock pulse CLK1 is input, and an input buffer 305 electrically connected to the clock input terminal 303. The logic circuits 309, which have been designed by the user and activated in response to the clock pulse CLK1, are disposed in plural form in the user design area 330. A clock supply circuit 311 is formed substantially in the center of the user design area 330 as seen in the direction in which the logic circuits 309 extend. The clock supply circuit 311 can drive all the logic circuits 309. The clock supply circuit 311 is electrically connected to the input buffer 305 so as to receive the clock pulse CLK1 therein.

An upper conductive pattern is fabricated above the user design area 303 with an insulating film interposed therebetween. The upper conductive pattern comprises a main conductive pattern 313 and a plurality of branch conductive patterns 315. The main conductive pattern 313 extends above the clock supply circuit 311 and is electrically connected to the output of the clock supply circuit 311 via a contact 317. The main conductive pattern 313 is disposed substantially in the center of the user design area 330 as seen in the transverse direction thereof and extends to a maximum along the longitudinal direction thereof. The main conductive pattern 313 is designed so as to have a broad width of 9.2 $\mu$m. The branch conductive patterns 315 are fabricated in plural form on both sides of the main conductive pattern 313 along the transverse direction of the user design area 330. A substantially equal number of logic circuits 309 are electrically connected to the respective branch conductive patterns 315 via contacts 319. The branch conductive patterns 315 are formed in such a manner that conductive patterns between the respective branch conductive patterns 315 and the logic circuits 309 electrically connected to the branch conductive patterns 315 take the shortest length and the substantially same number of logic circuits 309 are electrically connected to the respective branch conductive patterns 315. The number of the branch conductive patterns 315 to be disposed on both sides of the main conductive pattern 313 is not necessarily limited to the same number. It is also unnecessary to provide the branch conductive patterns 315 at equal intervals along the longitudinal direction of the user design area 330. The widths of the branch conductive patterns 315 are designed so as to have 2.4 $\mu$m and are wider than a normal conductive pattern width of 1.2 $\mu$m in the user design area 330.

The user design area 350 is identical in structure to the user design area 330 and its description will therefore be omitted. The user design area 370 is identical in structure to the user design area 330 except for branch conductive patterns 385 each having a width of 5.2 $\mu$m, and its description will therefore be omitted.

When the user design areas 330, 350, 370 are laid out by the CAD, they may be fabricated in a manner similar to the second embodiment.

According to the present invention, as described above, a clock supply circuit is disposed substantially in the center of each of logic circuit groups. The respective logic circuits are electrically connected to the clock supply circuit via a wide main conductive pattern and each of branch conductive patterns. It is therefore possible to supply clock pulses free of variations in time delays between the respective adjacent logic circuits.

User design areas also require only clock supply circuits respectively. Moreover, the variations in the time delays of the clock pulses are eliminated by using the shape of an upper conductive pattern. Therefore, no restrictions are placed on the user design areas.

Further, since the clock supply circuits, the main conductive patterns and the branch conductive patterns are fabricated along the logical module structures, the main conductive patterns and the branch conductive patterns can be formed at a minimum of number as necessary. Correspondingly, the loads borne by the main conductive patterns and the branch conductive patterns can be reduced and high-speed responsive clock pulses can be supplied to logic circuits. In addition, areas occupied by the main conductive patterns and the branch conductive patterns can be reduced, thereby making it possible to realize a reduction in size of a chip and process multiphase clocks.

Having now fully described the invention, it will be apparent to those skilled in the art that many changes and modifications can be made without departing from the spirit or scope of the invention as set forth herein.

What is claimed is:

1. A clock supply circuit having a circuit area comprising:
   an input terminal for receiving a clock pulse;
   a first buffer having an input electrically connected to said input terminal and an output, the first buffer disposed in the center of the circuit area;
   a main conductive pattern electrically connected to the output of said first buffer, said main conductive pattern having a first width and being disposed through the center of the circuit area;
   a plurality of branch conductive patterns each of which is electrically connected to said main conductive pattern and extends from said main conductive pattern, each of said branch conductive patterns having a second width being smaller than the first width and being disposed in the circuit area; and
   a plurality of clock receiving circuits each of which is electrically connected to one of said branch conductive patterns and disposed in the circuit area, a number of said clock receiving circuits electrically connected to one of said branch conductive patterns being substantially same to that of said clock receiving circuits electrically connected to another one of said branch conductive patterns.

2. A clock supply circuit according to claim 1, wherein said main conductive pattern extends to a first direction and each of said branch conductive patterns extends to a second direction which has substantially a right angle with the first direction.

3. A clock supply circuit according to claim 1, further comprising a second buffer electrically connected between said input terminal and the input of said first buffer.

4. A clock supply circuit according to claim 1, further comprising a plurality of circuit conductive patterns each of which electrically connects to one of said branch conductive patterns and one of said clock receiving circuits.

5. A clock supply circuit according to claim 4, wherein each of said circuit conductive patterns has a third width being smaller than the second width.

6. A clock supply circuit according to claim 4, wherein each of said circuit conductive patterns has same length.

7. A clock supply circuit according to claim 1, wherein said input terminal is disposed out of the circuit area.

8. A semicustom integrated circuit having a user design area comprising:
   an input terminal for receiving a clock pulse; and
   a clock supply circuit formed in the user design area, the clock supply circuit including,
   a first buffer having an input electrically connected to said input terminal and an output, the first buffer disposed in the center of the user design area,
   a main conductive pattern electrically connected to the output of said first buffer, said main conductive pattern having a first width and being disposed through the center of the user design area,
   a plurality of branch conductive patterns each of which is electrically connected to said main conductive pattern and extends from said main conductive pattern, each of said branch conductive patterns having a second width being smaller than the first width and being disposed in the user design area, and
   a plurality of user design circuits operated by the clock pulse, each of said user design circuits electrically connected to one of said branch conductive patterns and disposed in the user design area, a number of said user design circuits electrically connected to one of said branch conductive patterns being substantially same to that of said user design circuits electrically connected to another one of said branch conductive patterns.

9. A semicustom integrated circuit according to claim 8, wherein said main conductive pattern extends to a first direction and each of said branch conductive patterns extends to a second direction which has substantially a right angle with the first direction.

10. A semicustom integrated circuit according to claim 8, further comprising a second buffer electrically connected between said input terminal and the input of said first buffer.

11. A semicustom integrated circuit according to claim 8, further comprising a plurality of circuit conductive patterns each of which electrically connects to one of said branch conductive patterns and one of said user design circuits.

12. A semicustom integrated circuit according to claim 11, wherein each of said circuit conductive patterns has a third width being smaller than the second width.

13. A semicustom integrated circuit according to claim 8, wherein said input terminal is disposed out of the user design area.

14. A method of laying out a semicustom integrated circuit having a plurality of user design circuits disposed in a user design area and an input terminal receiving a clock pulse, the method comprising a step of:
   disposing a first buffer in the center of the user design area, the first buffer having an input electrically connected to said input terminal and an output;
   disposing the user design circuits in the user design area;
   forming a main conductive pattern having a first width over the first buffer, the main conductive pattern electrically connected to the output of said first buffer and disposed through the center of the user design area;
   forming in the user design area a plurality of branch conductive patterns each of which has a second width being smaller than the first width, each of branch conductive patterns extending from the main conductive pattern and being electrically connected to the main conductive pattern; and
   forming in the user design area a plurality of circuit conductive patterns each of which has a third width smaller than the second width and electrically connects to one of said branch conductive patterns and to one of the user design circuits so that a number of the user design circuits electrically connected to one of the branch conductive patterns is substantially same to that of the user design circuits electrically connected to another one of the branch conductive patterns and each of the circuit conductive patterns has the same length.

15. A method of laying out a semicustom integrated circuit according to claim 14, further comprising a step of extending said main conductive pattern to a first direction and extending each of said branch conductive patterns to a second direction which has substantially a right angle with the first direction.

16. A method of laying out a semicustom integrated circuit according to claim 14, further comprising the step of forming a second buffer electrically connected between said input terminal and the input of said first buffer.

17. A method of laying out a semicustom integrated circuit according to claim 14, further comprising a step of disposing said input terminal out of the user design area.

* * * * *